US010163638B2

(12) United States Patent
Ningaraju et al.

(10) Patent No.: US 10,163,638 B2
(45) Date of Patent: Dec. 25, 2018

(54) HIGH-VOLTAGE SEMICONDUCTOR DEVICE

(71) Applicant: Nuvoton Technology Corporation, Hsinchu Science Park (TW)

(72) Inventors: Vivek Ningaraju, mysore (IN); Po-An Chen, Miaoli County (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 15/640,995

(22) Filed: Jul. 3, 2017

(65) Prior Publication Data

US 2018/0102250 A1  Apr. 12, 2018

(30) Foreign Application Priority Data

Oct. 11, 2016  (TW) .............................. 105132700 A (51) Int. Cl.
*H01L 21/20* (2006.01)
*H01L 29/08* (2006.01)
(Continued)

(52) U.S. Cl.
CPC .......... *H01L 21/20* (2013.01); *H01L 29/0865* (2013.01); *H01L 29/0882* (2013.01);
(Continued)

(58) Field of Classification Search
CPC ......... H01L 21/20; H01L 29/08; H01L 29/41; H01L 29/49; H01L 29/78; H01L 29/0865;
(Continued)

(56) References Cited

U.S. PATENT DOCUMENTS

2003/0168712 A1* 9/2003 Shin ..................... H01L 21/761
257/510
2007/0176220 A1* 8/2007 Takahashi ........... H01L 29/0692
257/301
(Continued)

FOREIGN PATENT DOCUMENTS

TW    201532244 A    8/2015

OTHER PUBLICATIONS

Taiwanese Office Action of corresponding TW application No. 105132700, dated Apr. 26, 2017.
(Continued)

*Primary Examiner* — Fazli Erdem
(74) *Attorney, Agent, or Firm* — Muncy, Geissler, Olds. & Lowe, P.C.

(57) ABSTRACT

High-voltage semiconductor devices are provided. The high-voltage semiconductor device includes a substrate having a first conductive type and an epitaxial layer having a second conductive type disposed on the substrate. The epitaxial layer includes a high-voltage unit, a low-voltage unit disposed around the high-voltage unit and a level-shift unit disposed between the high-voltage unit and the low-voltage unit. The level-shift unit includes a source region, a drain region having disposed between the source region and the high-voltage unit, wherein the drain region is electrically connected to the high-voltage unit by a drain electrode disposed above the drain region. The level unit includes a gate electrode disposed between the source region and the drain region. The high-voltage semiconductor device also includes an isolation structure disposed between the high-voltage unit and the low-voltage unit, and the isolation structure is disposed directly under the drain electrode.

19 Claims, 8 Drawing Sheets

(51) Int. Cl.
  *H01L 29/417* (2006.01)
  *H01L 29/49* (2006.01)
  *H01L 29/786* (2006.01)
  *H01L 29/06* (2006.01)
(52) U.S. Cl.
  CPC .... *H01L 29/41725* (2013.01); *H01L 29/4983* (2013.01); *H01L 29/78609* (2013.01); *H01L 29/0611* (2013.01)
(58) Field of Classification Search
  CPC ........... H01L 29/0882; H01L 29/41725; H01L 29/4983; H01L 29/78609
  See application file for complete search history.

(56) References Cited

U.S. PATENT DOCUMENTS

| | | | | |
|---|---|---|---|---|
| 2008/0074165 | A1* | 3/2008 | Jeon | H01L 27/0629 327/333 |
| 2008/0290461 | A1* | 11/2008 | Moens | H01L 21/76224 257/536 |
| 2009/0152668 | A1* | 6/2009 | Sone | H01L 23/49589 257/501 |
| 2009/0243696 | A1 | 10/2009 | Jeon et al. | |
| 2010/0025761 | A1* | 2/2010 | Voldman | H01L 21/823892 257/338 |
| 2010/0176480 | A1* | 7/2010 | Senda | H01L 21/84 257/501 |
| 2014/0264583 | A1* | 9/2014 | Yamaji | H01L 27/088 257/339 |
| 2014/0264585 | A1* | 9/2014 | Moon | H01L 29/7816 257/343 |
| 2016/0372360 | A1* | 12/2016 | Fang | H01L 21/76229 |
| 2017/0062610 | A1* | 3/2017 | Agam | H01L 29/7823 |
| 2017/0279449 | A1* | 9/2017 | Fang | H03K 19/017509 |

OTHER PUBLICATIONS

Office Action dated Dec. 28, 2017 which issued in corresponding Taiwanese application TW105132700.

* cited by examiner

HIGH-VOLTAGE SEMICONDUCTOR DEVICE

CROSS REFERENCE TO RELATED APPLICATIONS

This Application claims priority of Taiwan Patent Application No. 105132700, filed on Oct. 11, 2016, entitled "high-voltage semiconductor device", which application is hereby incorporated by reference in its entirety.

BACKGROUND OF THE INVENTION

Field of the Invention

The present invention relates to a semiconductor device, and in particular to a high-voltage semiconductor device.

Description of the Related Art

High-voltage semiconductor devices are applied to integrated circuits with high-voltage and high power. Traditional high-voltage semiconductor devices, such as a vertically diffused metal oxide semiconductor (VDMOS) or a laterally diffused metal oxide semiconductor (LDMOS), are mainly used for devices operated under at least 18 volts or higher. The advantages of high-voltage device technology include cost effectiveness and process compatibility, and this is why High-voltage device technology has been widely used in display driver IC devices, power supply devices, and such fields as power management, communications, automatics, and industrial control.

A high-voltage semiconductor device includes a high-voltage unit, a low-voltage unit and a level-shift unit disposed between the high-voltage unit and the low-voltage unit. The level-shift unit reduces voltage from the high-voltage unit, and reduced voltage is provided to the low-voltage unit. The level-shift unit also raises voltage from the low-voltage unit, and the raised voltage is provided to the high-voltage unit. However, a signal being transmitted from the low-voltage unit to the high-voltage unit without going through the level-shift unit occurs in conventional high-voltage semiconductor devices, which results in current leakage.

Therefore, it is necessary to develop a new high-voltage semiconductor device that can solve or improve the problems described above.

BRIEF SUMMARY OF THE INVENTION

The disclosure provides a high-voltage semiconductor device. The high-voltage semiconductor device includes a substrate having a first conductive type and an epitaxial layer having a second conductive type disposed on the substrate. The epitaxial layer includes a high-voltage unit, a low-voltage unit disposed around the high-voltage unit and a level-shift unit disposed between the high-voltage unit and the low-voltage unit. The level-shift unit includes a source region having a second conductive type, a drain region having a second conductive type disposed between the source region and the high-voltage unit, and the drain region is electrically connected to the high-voltage unit by a drain electrode disposed above the drain region. The level-shift unit also includes a gate electrode disposed between the source region and the drain region. The high-voltage semiconductor device also includes an isolation structure disposed between the high-voltage unit and the low-voltage unit, and the isolation structure is disposed directly under the drain electrode.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be noted that the elements or devices in the drawings of the present disclosure may be present in any form or configuration known to those skilled in the art. In addition, the expression "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

The terms "about" and "substantially" typically mean+/−20% of the stated value, more typically +/−10% of the stated value, more typically +/−5% of the stated value. The stated value of the present disclosure is an approximate value.

When there is no specific description, the stated value includes the meaning of "about" or "substantially".

It should also be noted that the present disclosure presents embodiments of a high-voltage semiconductor device, and may be included in an integrated circuit (IC) such as a microprocessor, memory device, and/or another IC. The IC may also include various passive and active microelectronic devices, such as thin film resistors, other capacitors (e.g. metal-insulator-metal capacitor, MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize other embodiments of semiconductor devices that may benefit from aspects of the present disclosure.

Figure 1:
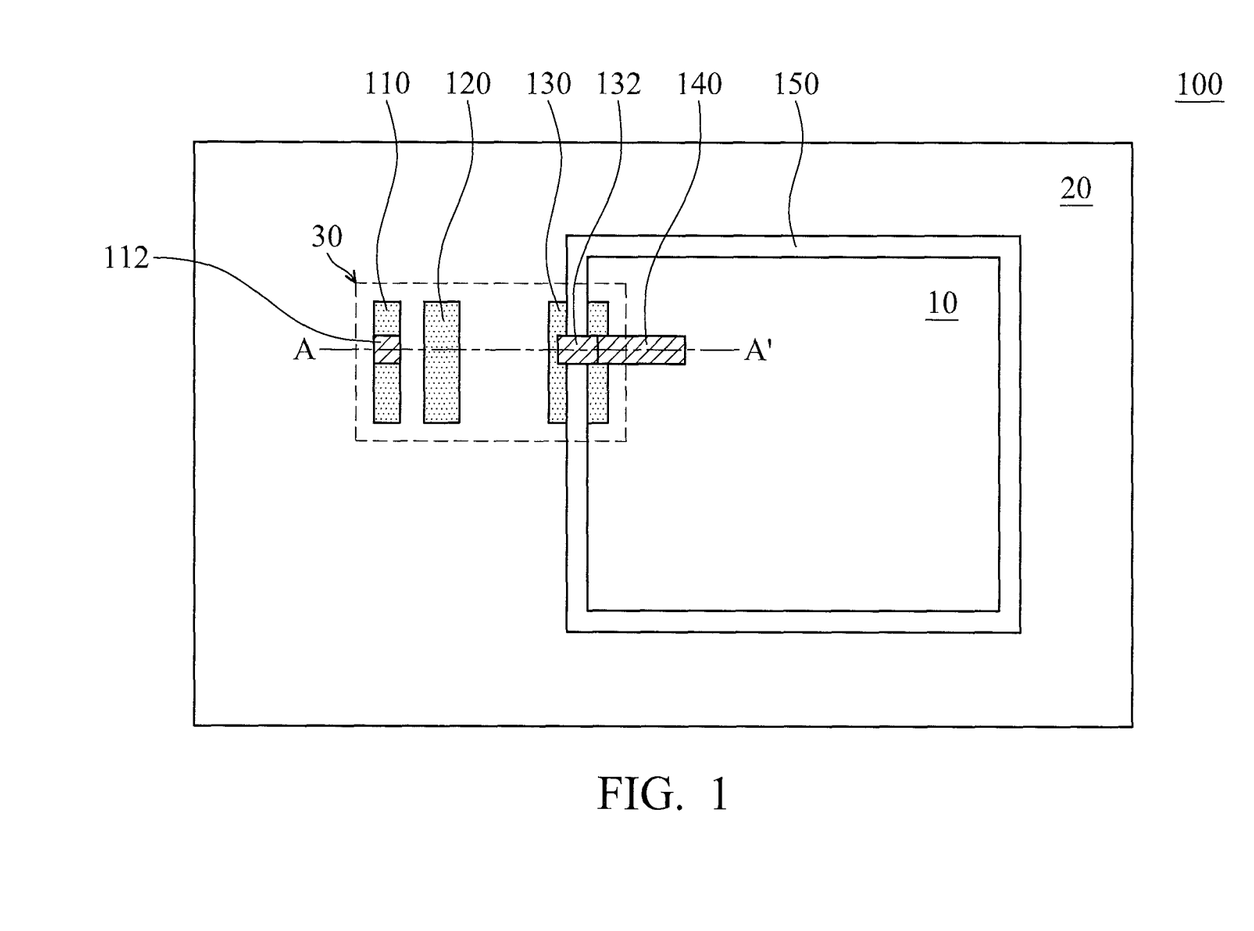
FIG. 1 is a top view of a high-voltage semiconductor device in accordance with an embodiment of the present invention.

Referring to FIG. 1, FIG. 1 is a top view of a high-voltage semiconductor device 100 in accordance with an embodiment of the present invention.

As shown in FIG. 1, the high-voltage semiconductor device 100 includes a high-voltage unit 10, a low-voltage unit 20 and a level-shift unit 30. The low-voltage unit 20 is disposed around the high-voltage unit 10. The level-shift unit 30 is disposed between the high-voltage unit 10 and the low-voltage unit 20. In addition, the high-voltage semiconductor device 100 includes an isolation structure 150. The isolation structure 150 is disposed between the high-voltage unit 10 and the low-voltage unit 20, and the high-voltage unit 10 is surrounded by the isolation structure 150.

As shown in FIG. 1, the level-shift unit 30 includes a source region 110, a drain region 130, and a gate region 120 disposed between the source region 110 and the drain region 130. In some embodiments, as shown in FIG. 1, the drain region 130 is disposed between the source region 110 and the high-voltage unit 10, and the level-shift unit 30 is electrically connected to the high-voltage unit 10 through a drain electrode 132 and a wire 140. The source region 110 may be electrically connected to other device (not shown) by a source region electrode 112. In addition, from a top view, the isolation structure 150 is a closed ring, and the drain region 130 is divided to two portions by the ring of the isolation structure 150. The two portions of the drain region 130 are both in direct contact with the drain electrode 132, and are electrically connected to the high-voltage unit 10.

It should be noted that in order to clearly depict the layout of the high-voltage unit 10, the low-voltage unit 20, the level-shift unit 30 and the isolation structure 150, only one level-shift unit 30 (SET) is shown in FIG. 1. In practical implementation, the high-voltage semiconductor device 100 may include another level-shift unit (RESET) having similar layout to that of the level-shift unit 30.

Figure 2:
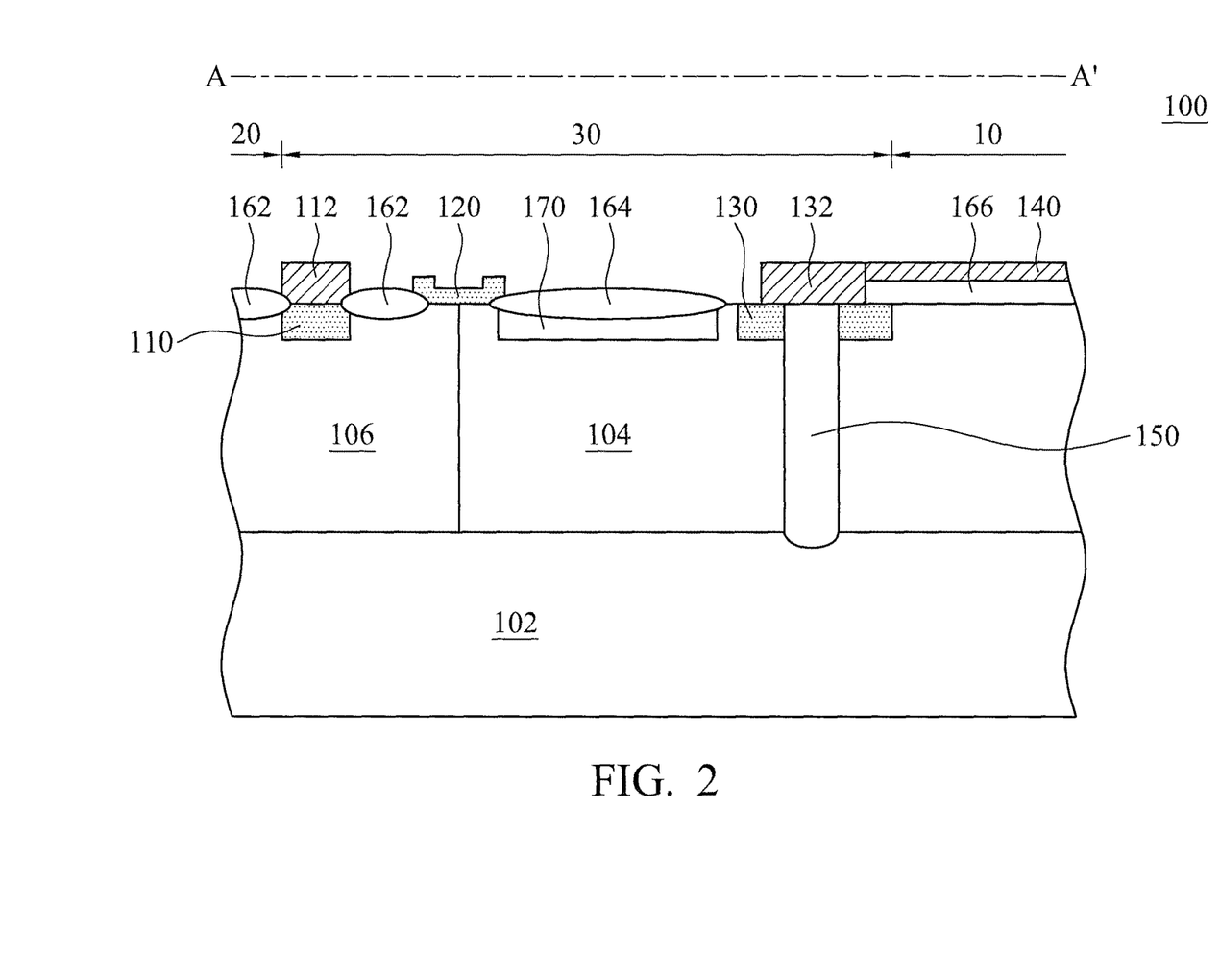
FIG. 2 is a cross-sectional view taken alone a line A-A' of the high-voltage semiconductor device of FIG. 1.

Referring to FIG. 2, FIG. 2 is a cross-sectional view taken alone a line A-A' of the high-voltage semiconductor device 100 of FIG. 1. The high-voltage semiconductor device 100 includes a substrate 102. The substrate 102 may include, but is not limited to, a semiconductor substrate such as a silicon substrate. In addition, the substrate 102 may include an elemental semiconductor which may include germanium; a compound semiconductor which may include silicon carbide, gallium arsenide, gallium phosphide, indium phosphide, indium arsenide and/or indium antimonide; an alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 102 may include a semiconductor-on-insulator (SOI).

In addition, the high-voltage semiconductor device 100 includes an epitaxial layer 104 disposed over the substrate 102. The epitaxial layer 104 may include, but is not limited to, Si, Ge, SiGe, III-V compound, or a combination thereof. The epitaxial layer 104 may be formed by an epitaxial growth step, such as metal-organic chemical vapor deposition (MOCVD), metal-organic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments, the substrate 102 has a first conductive type such as P type, and the epitaxial layer 104 has a second conductive type such as N type. Furthermore, the high-voltage semiconductor device 100 also includes a high-voltage well region 106 formed in the epitaxial layer 104. The high-voltage well region 106 has the first conductive type such as P type.

In addition, as shown in FIG. 2, the high-voltage semiconductor device 100 includes field oxide layers 162 and 164 and an isolation layer 166. In some embodiments, the field oxide layers 162 and 164 may be formed by a local oxidation of silicon (LOCOS) process, and the isolation layer 166 may be formed by a chemical vapor deposition (CVD) process.

As shown in FIG. 2, the source region 110 and the gate region 120 are separated from the field oxide layer 162. Furthermore, the gate region 120 is separated from the drain region 130 by the field oxide layer 164. The source region 110 and the drain region 130 have the second conductive type such as N type. In addition, the epitaxial layer 104 includes a reduced surface field (RESURF) doped region 170 which is formed under the field oxide layer 164, and between the source region 110 and the drain region 130. The RESURF doped region 170 has the second conductive type such as P type.

The gate region 120 is disposed between the source region 110 and the drain region 130, and a portion of the gate region 120 extends to above the field oxide layers 162 and 164. The gate region 120 may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previously described chemical vapor deposition (CVD), sputtering, resistive thermal evaporation, electron beam evaporation, or any other suitable method.

In some embodiments, as shown in FIG. 2, the high-voltage semiconductor device 100 further includes the isolation structure 150. The isolation structure 150 is disposed directly under the drain electrode 132, and in direct contact with the drain electrode 132. As shown in FIG. 2, the isolation structure 150 extends from a bottom surface of the drain electrode 132 to the substrate 102, and penetrates through the epitaxial layer 104 and the drain region 130. In some embodiments, the isolation structure 150 is a deep trench isolation structure and is formed of a dielectric material, such as a silicon oxide, silicon nitride, silicon oxynitride or other dielectric materials. A photolithography and an etching process are performed to form a trench (not shown) in the substrate 102. The dielectric material is filled into the trench by a deposition process to form the isolation structure 150. The photolithography process includes photoresist coating (e.g., spin-on coating), soft baking, mask alignment, exposure, post-exposure baking, developing the photoresist, rinsing and drying (e.g., hard baking). The photolithography process may also be implemented or replaced by another proper method such as maskless photolithography, electron-beam writing or ion-beam writing. The etching process may include dry etching, wet etching, and other etching methods.

The isolation structure 150 is disposed for preventing the high-voltage semiconductor device 100 from current leakage. For example, when a voltage is applied on the gate region 120 of conventional high-voltage semiconductor devices, the current may be transmitted from the low-voltage unit to the high-voltage unit through the epitaxial layer, and it may cause the current leakage the reduced breakdown voltage. In conventional high-voltage semiconductor devices, a doped region is formed in the epitaxial layer between the level-shift unit and the high-voltage unit for prevent current leakage. However, this method is not fully satisfactory. In the embodiments of the present invention, the isolation structure 150 penetrates through the epitaxial layer 104. Namely, the low-voltage unit 20 is electrically separated from the high-voltage unit 10 by the isolation structure 150. Accordingly, the current transmitted from the low-voltage unit 20 to the high-voltage unit 10 through the level-shift unit 30 is prevented effectively. Therefore, current leakage is restrained without altering the magnitude of the breakdown voltage.

Figure 3:
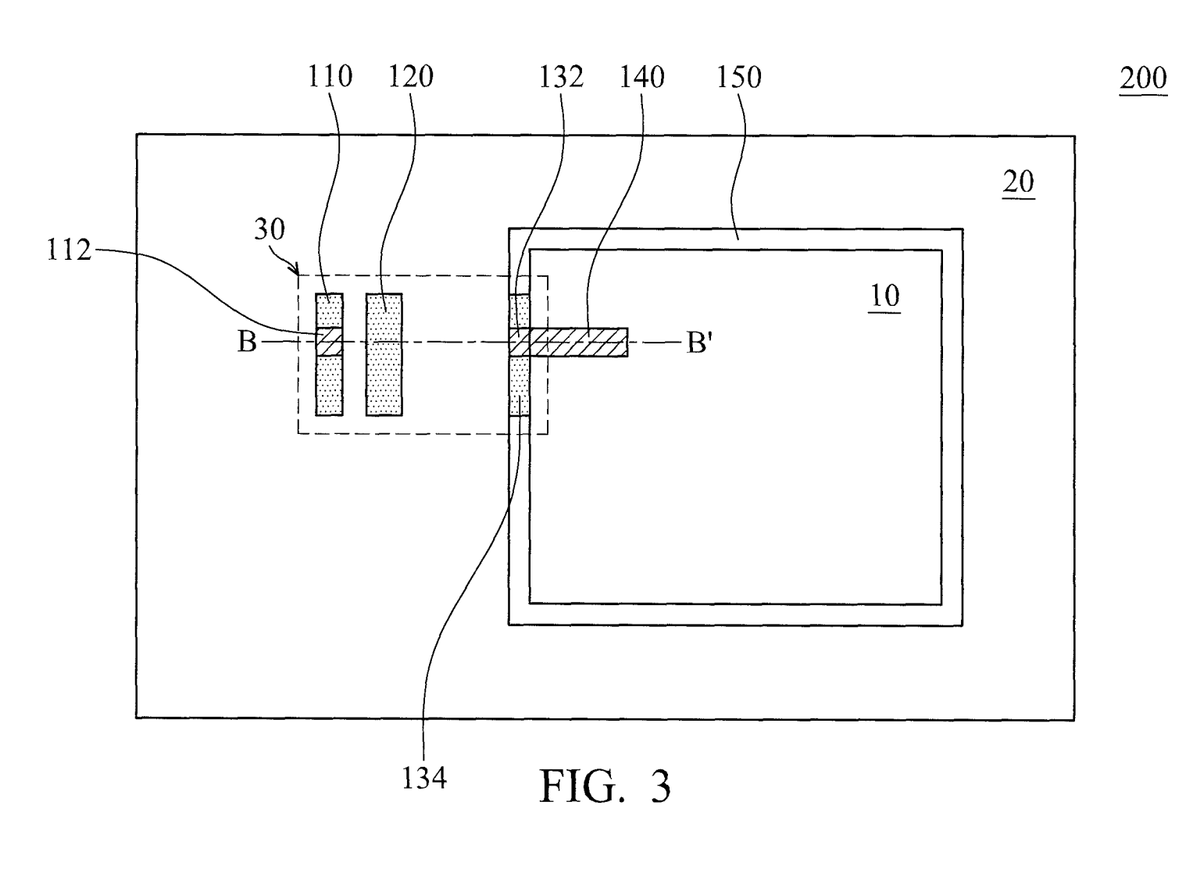
FIG. 3 is a top view of a high-voltage semiconductor device in accordance with an embodiment of the present invention.
Figure 4:
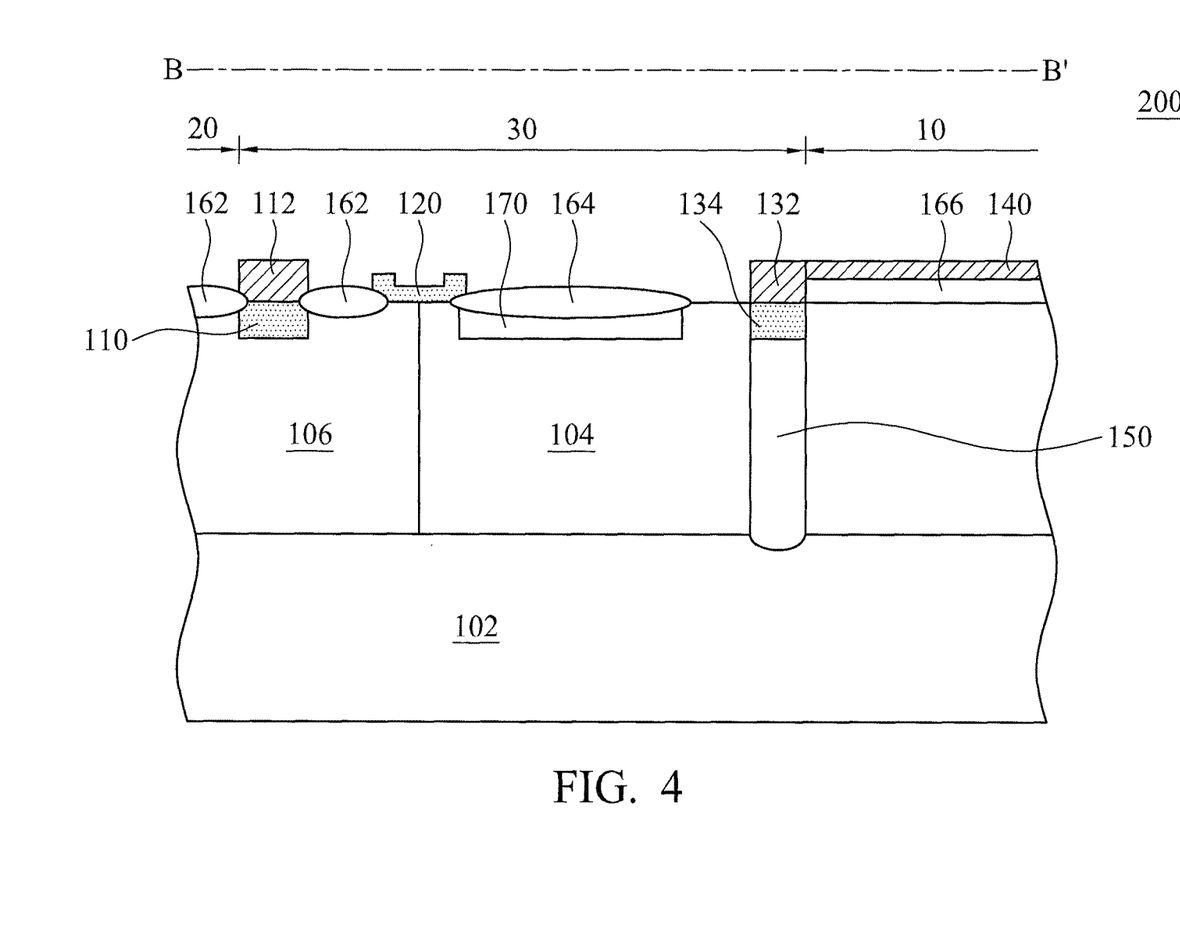
FIG. 4 is a cross-sectional view taken alone a line B-B' of the high-voltage semiconductor device of FIG. 3.

Referring to FIGS. 3-4, FIG. 3 is a top view of a high-voltage semiconductor device 200 in accordance with some embodiments, and FIG. 4 is a cross-sectional view taken alone a line B-B' of the high-voltage semiconductor device 200 shown in FIG. 3. Descriptions of elements of the embodiments hereinafter that are the same or similar as those previously described with reference to FIGS. 1-2 are omitted for brevity.

One of the differences between the high-voltage semiconductor device 200 shown in FIGS. 3-4 and the high-voltage semiconductor device 100 shown in FIGS. 1-2 is that a portion of the isolation structure 150 is replaced by a drain region 134. In some embodiments, the drain region 134 is formed by a polysilicon layer, and this polysilicon layer may be doped with the dopant having the second conductive type such as N type. In some embodiment, as shown in FIG. 3, the isolation structure 150 and the drain region 134 form a closed ring in a top view. Namely, the polysilicon layer and the isolation structure 150 form a closed ring.

In some embodiments, as shown in FIG. 4, the isolation structure 150 is not in direct contact with the drain electrode 132, and the isolation structure 150 is separated from the drain electrode 132 by the drain region 134. In this embodiment, the epitaxial layer 104 is penetrated by the drain region 134 and the isolation structure 150, and the top surface of the isolation structure 150 is in direct contact with the bottom surface of the polysilicon layer which is used as the drain region 134. In this embodiment, the polysilicon layer is disposed over the isolation structure 150. In addition, the polysilicon layer and the isolation structure 150 are disposed in one and the same trench. Namely, the drain region 134 and the isolation structure 150 are disposed in one and the same trench in this embodiment. In this embodiment, the drain region 134 is not penetrated by the isolation structure 150.

In some embodiments, from a top view as shown in FIG. 3, the width of the drain region 134 is the same as the width of the isolation structure 150 along line B-B'. Namely, the width of the polysilicon layer is the same as the width of the isolation structure 150 along line B-B'. Furthermore, as shown in FIG. 4, a projection of the isolation structure 150 on the substrate 102 overlaps a projection of the drain region 134 on the substrate 102. Furthermore, in some embodiments, from a top view as shown in FIG. 3, a portion of the isolation structure 150 is replaced by the drain region 134. Namely, the drain region 134 is not a complete ring.

In this embodiment, the drain region 134 is formed by the polysilicon layer doped with the dopant having the second conductive type, and the width of the polysilicon layer is the same as the width of the isolation structure 150. Compared to the drain region 130 of the high-voltage semiconductor device 100 shown in FIGS. 1-2, the drain region 134 of the high-voltage semiconductor device 200 shown in FIGS. 3-4 has a smaller size. Therefore, the size of the high-voltage semiconductor device 200 may be reduced and more devices may be formed in the same area. Accordingly, it improves the efficiency of the high-voltage semiconductor device 200.

Figure 5:
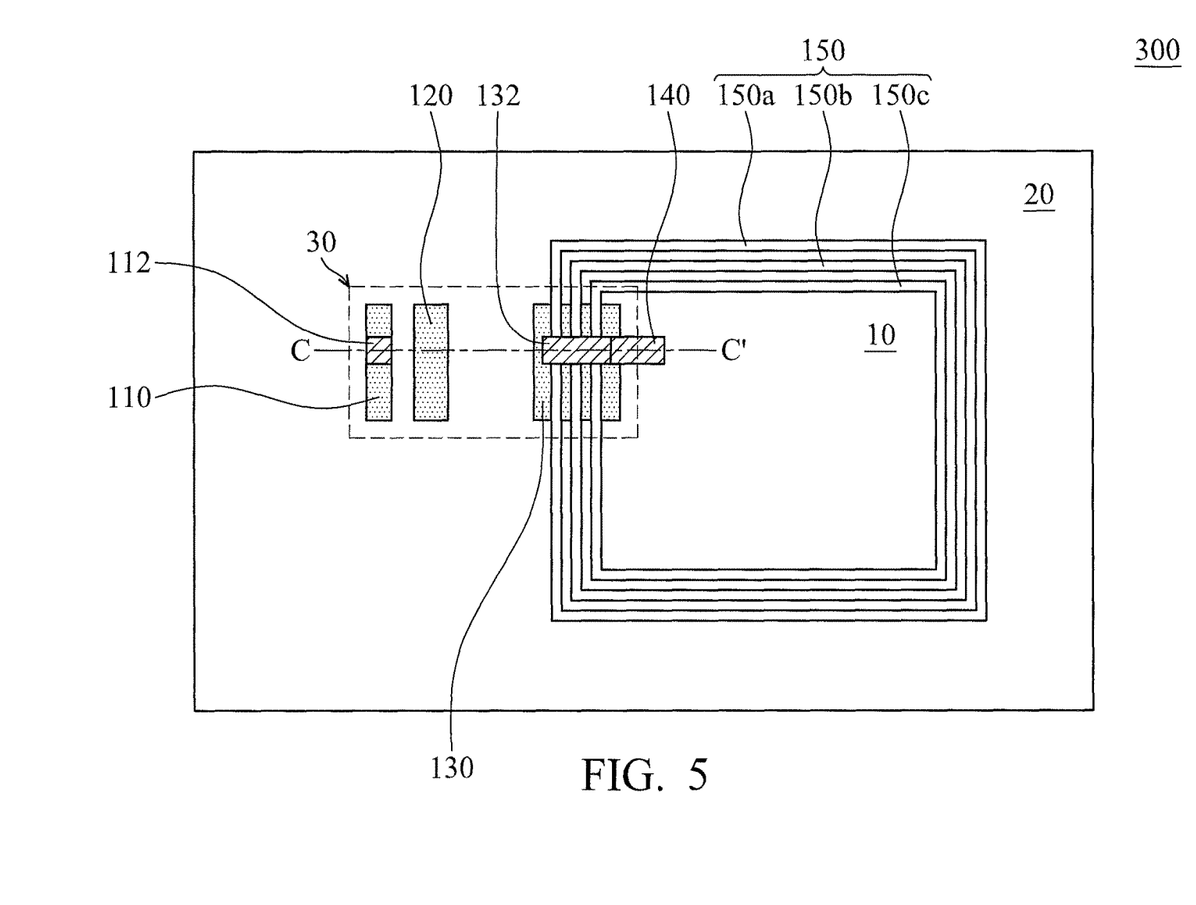
FIG. 5 is a top view of a high-voltage semiconductor device in accordance with an embodiment of the present invention.
Figure 6:
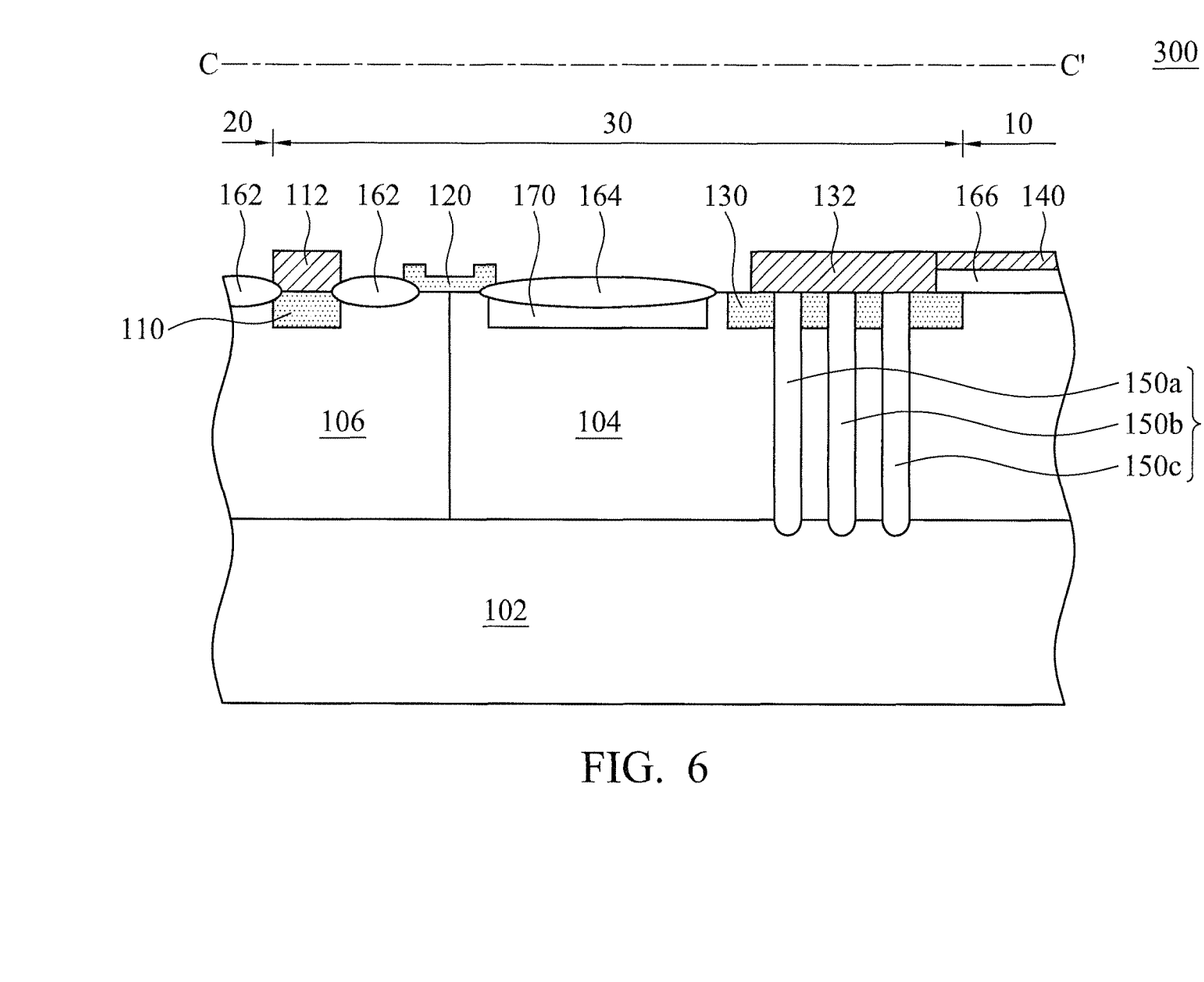
FIG. 6 is a cross-sectional view taken alone a line C-C' of the high-voltage semiconductor device of FIG. 5.

Referring to FIGS. 5-6, FIG. 5 is a top view of a high-voltage semiconductor device 300 in accordance with some embodiments, and FIG. 6 is a cross-sectional view taken alone a line C-C' of the high-voltage semiconductor device 300 shown in FIG. 5. Descriptions of elements of the embodiments hereinafter that are the same as or similar to those previously described with reference to FIGS. 1-4 are omitted for brevity.

One of the differences between the high-voltage semiconductor device 300 shown in FIGS. 5-6 and the high-voltage semiconductor device 100 shown in FIGS. 1-2 is that the isolation structure 150 of the high-voltage semiconductor device 300 may include multiple isolation units 150a, 150b and 150c. From a top view, the isolation units 150a, 150b and 150c are the rings that have different sizes and are separated from each other. Moreover, the isolation units 150a, 150b, and 150c are all disposed around the high-voltage unit 10. In this embodiment, the inner isolation unit is surrounded by the outer isolation unit. For example, the isolation unit 150c is surrounded by the isolation unit 150a and the isolation unit 150b.

As shown in FIG. 6, the isolation units 150a, 150b, and 150c extend from the bottom surface of the drain electrode 132 to the substrate 102. As shown in FIG. 6, each of isolation units 150a, 150b and 150c penetrates through the epitaxial layer 104 and the drain region 130. The high-voltage unit 10 is electrically separated from the low-voltage unit 20 by the isolation units 150a, 150b, and 150c. Namely, the isolation units 150a, 150b and 150c may prevent the current from being transmitted from the low-voltage unit 20 to the high-voltage unit 10 through the epitaxial layer 104, and thus current leakage is restrained in the high-voltage semiconductor device 300. Furthermore, compared to the high-voltage semiconductor device 100 shown in FIGS. 1-2, the isolation structure 150 includes multiple isolation units 150a, 150b, and 150c to provide an effect of multiple isolation, thereby electrically separating the high-voltage unit 10 from the low-voltage unit 20 more effectively. Therefore, the current leakage is restrained in the high-voltage semiconductor device 300.

Figure 7:
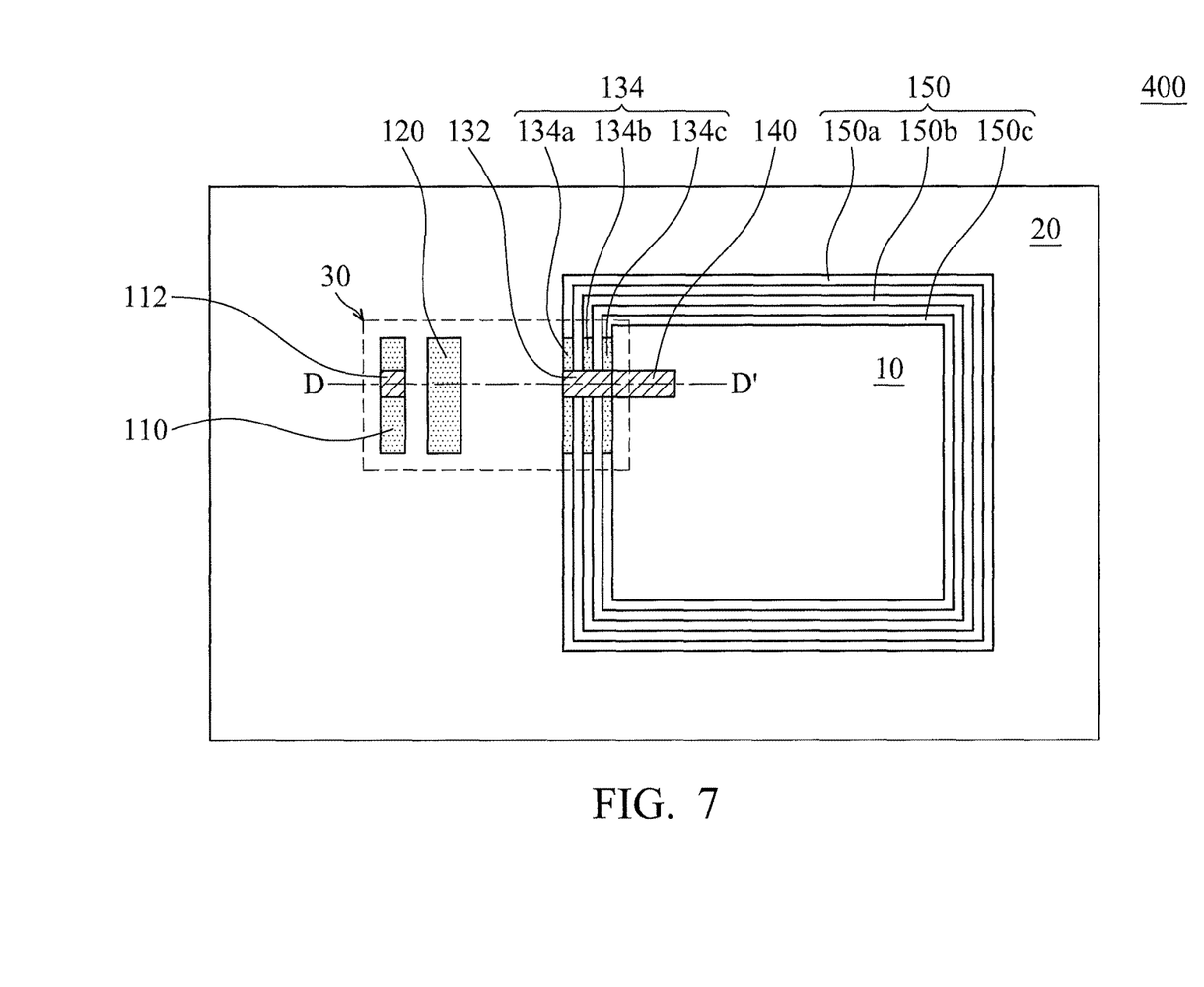
FIG. 7 is a top view of a high-voltage semiconductor device in accordance with an embodiment of the present invention.
Figure 8:
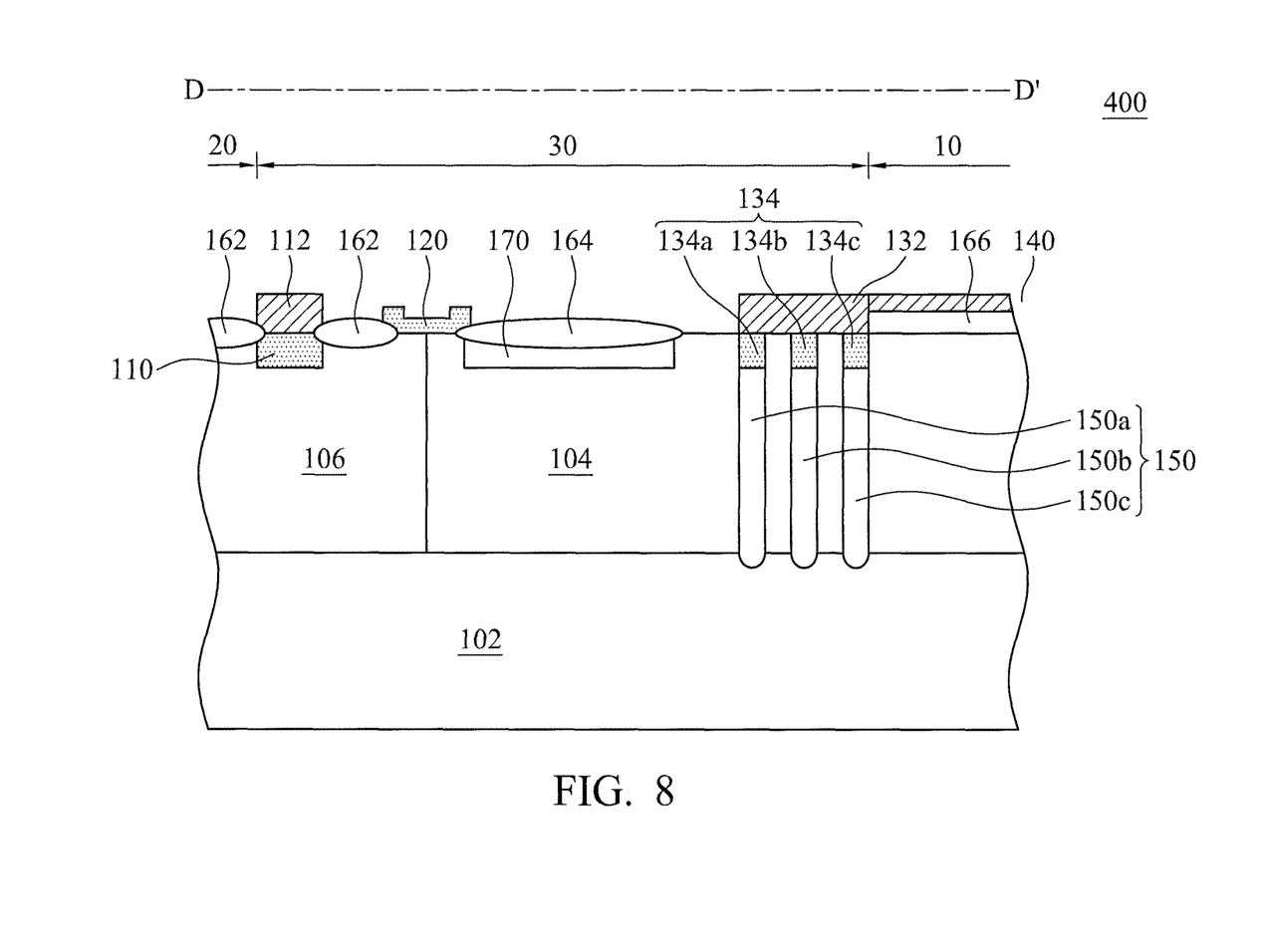
FIG. 8 is a cross-sectional view taken alone a line D-D' of the high-voltage semiconductor device of FIG. 7.

Referring to FIGS. 7-8, FIG. 7 is a top view of a high-voltage semiconductor device 400 in accordance with some embodiments, and FIG. 8 is a cross-sectional view taken alone a line D-D' of the high-voltage semiconductor device 400 shown in FIG. 8. Descriptions of elements of the embodiments hereinafter that are the same or similar as those previously described with reference to FIGS. 1-6 are omitted for brevity.

One of the differences between the high-voltage semiconductor device 400 shown in FIGS. 7-8 and the high-voltage semiconductor device 200 shown in FIGS. 3-4 is that the isolation structure 150 may include a plurality of isolation units 150a, 150b and 150c, and the drain region 134 includes a plurality of regions 134a, 134b and 134c. In some embodiments, from a top view shown in FIG. 7, a width of the isolation units 150a, 150b and 150c is the same as a width of the corresponding regions 134a, 134b and 134c of the drain region 134 along line D-D'. In this embodiment, top surfaces of the isolation units 150a, 150b and 150c are contact with corresponding top surfaces of the regions 134a, 134b and 134c of the drain region 134. For example, a top surface of the isolation unit 150a is in contact with a bottom surface of the region 134a of the drain region 134.

As shown in FIG. 8, the epitaxial layer 104 is penetrated by the regions 134a, 134b and 134c of the drain region 134 and the isolation units 150a, 150b and 150c of the isolation structure 150, so that the isolation units 150a, 150b and 150c disposed in the high-voltage semiconductor device the 400 may provide effect of multiple isolation to prevent the current from being transmitted from the low-voltage unit 20 to the high-voltage unit 10 through the epitaxial layer 104, and thereby leakage is restrained.

In the embodiments of the present invention, the deep trench isolation structure disposed between the high-voltage unit and the level-shift unit may restrain leakage. In addition, the deep trench isolation structure mentioned above has the advantages of a simple design, and it does not impact the magnitude of the punch through voltage or the breakdown voltage.

In the embodiments of the present invention, the polysilicon layer disposed above the isolation structure may be used as the drain region of the high-voltage semiconductor device. Accordingly, leakage is restrained and the size of the device is reduced. Therefore, it improves the efficiency of the high-voltage semiconductor device. It should be noted that although there are only three isolation units shown in FIGS. 5-8, the number of isolation units is not limited thereto. Furthermore, the width of the isolation structure or the isolation unit is not limited thereto. Generally, the width of the isolation structure or the isolation unit is smaller than the width of the drain electrode. Furthermore, the depth of the drain region formed by the polysilicon layer shown in FIGS. 3-4 and 7-8 is not limited thereto. In other embodiments, the first conductive type is N type, and the second conductive type is P type.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A high-voltage semiconductor device, comprising:
a substrate having a first conductive type;
an epitaxial layer having a second conductive type disposed on the substrate, wherein the epitaxial layer comprises:
a high-voltage unit;
a low-voltage unit disposed around the high-voltage unit; and
a level-shift unit disposed between the high-voltage unit and the low-voltage unit, wherein the level-shift unit comprises:
a source region having a second conductive type;
a drain region having a second conductive type disposed between the source region and the high-voltage unit, wherein the drain region is electrically connected to the high-voltage unit by a drain electrode disposed over the drain region; and
a gate electrode disposed between the source region and the drain region; and
an isolation structure disposed in a trench, and the isolation structure is disposed directly under the drain electrode, wherein the isolation structure extends from a bottom surface of the drain electrode and penetrates the epitaxial layer, and wherein the drain region is in direct contact with the isolation structure, and the low-voltage unit is electrically separated from the high-voltage unit by the isolation structure.

2. The high-voltage semiconductor device as claimed in claim 1, wherein the isolation structure is disposed around the high-voltage unit.

3. The high-voltage semiconductor device as claimed in claim 1, wherein the isolation structure comprises a dielectric material.

4. The high-voltage semiconductor device as claimed in claim 1, wherein the drain region comprises a polysilicon layer having the second conductive type.

5. The high-voltage semiconductor device as claimed in claim 1, wherein the isolation structure comprises a plurality of isolation units which are separated from each other, and every isolation unit penetrates through the epitaxial layer.

6. The high-voltage semiconductor device as claimed in claim 5, wherein every isolation unit penetrates through the drain region.

7. The high-voltage semiconductor device as claimed in claim 5, wherein the drain region comprises a plurality of polysilicon regions separated from each other, and every isolation unit has a projection on the substrate overlapping with a corresponding projection of the polysilicon region on the substrate.

8. The high-voltage semiconductor device as claimed in claim 7, wherein every polysilicon region has a first width, the isolation unit has a second width, and the first width is the same as the second width.

9. The high-voltage semiconductor device as claimed in claim 7, wherein a bottom surface of the polysilicon region is in contact with a top surface of the isolation unit.

10. The high-voltage semiconductor device as claimed in claim 1, wherein the isolation structure penetrates through the drain region.

11. The high-voltage semiconductor device as claimed in claim 1, wherein the isolation structure and the drain region form a closed ring.

12. A high-voltage semiconductor device, comprising:
a substrate having a first conductive type;
an epitaxial layer having a second conductive type disposed on the substrate, wherein the epitaxial layer comprises:
  a high-voltage unit;
  a low-voltage unit disposed around the high-voltage unit; and
  a level-shift unit disposed between the high-voltage unit and the low-voltage unit, wherein the level-shift unit comprises:
    a source region having a second conductive type;
    a drain region having a second conductive type disposed between the source region and the high-voltage unit, wherein the drain region is electrically connected to the high-voltage unit by a drain electrode disposed over the drain region; and
    a gate electrode disposed between the source region and the drain region; and
an isolation structure disposed in a trench between the high-voltage unit and the low-voltage unit, and the isolation structure is disposed directly under the drain electrode, wherein the drain region comprises a polysilicon layer having the second conductive type, and the polysilicon layer and the isolation structure have a same width at an interface between the polysilicon layer and the isolation structure.

13. The high-voltage semiconductor device as claimed in claim 12, wherein the drain region is not penetrated by the isolation structure.

14. The high-voltage semiconductor device as claimed in claim 12, wherein the polysilicon layer and the isolation structure are disposed in the trench.

15. The high-voltage semiconductor device as claimed in claim 14, wherein the polysilicon layer is disposed over the isolation structure.

16. The high-voltage semiconductor device as claimed in claim 14, wherein the polysilicon layer and the isolation structure are disposed in the same trench.

17. The high-voltage semiconductor device as claimed in claim 12, wherein the epitaxial layer is penetrated by the isolation structure and the polysilicon layer.

18. The high-voltage semiconductor device as claimed in claim 12, wherein a projection of the polysilicon layer on the substrate overlaps with a projection of the isolation structure on the substrate.

19. The high-voltage semiconductor device as claimed in claim 12, wherein a bottom surface of the polysilicon layer is in contact with a top surface of the isolation structure.

* * * * *